US012732166B2

(12) United States Patent
Hong

(10) Patent No.: US 12,732,166 B2
(45) **Date of Patent: *Sep. 8, 2026**

(54) MATCH-SLAVE LATCH WITH SKEWED CLOCK

(71) Applicant: Taiwan Semiconductor Manufacturing Company, Ltd., Hsinchu (TW)

(72) Inventor: Hyunsung Hong, Kanata (CA)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/883,664

(22) Filed: Aug. 9, 2022

(65) Prior Publication Data

US 2022/0385278 A1 Dec. 1, 2022

Related U.S. Application Data

(63) Continuation of application No. 17/075,759, filed on Oct. 21, 2020, now Pat. No. 11,451,217.

(60) Provisional application No. 62/926,601, filed on Oct. 28, 2019.

(51) Int. Cl.

| | |
|---|---|
| ***H03K 3/03*** | (2006.01) |
| ***H03K 3/037*** | (2006.01) |
| ***H03K 19/20*** | (2006.01) |

(52) U.S. Cl.
CPC ........... *H03K 3/0372* (2013.01); *H03K 19/20* (2013.01)

(58) Field of Classification Search
CPC .... H03K 3/012; H03K 3/0372; H03K 3/0375; H03K 3/35625; H03K 3/289
See application file for complete search history.

(56) References Cited

U.S. PATENT DOCUMENTS

| | | | | |
|---|---|---|---|---|
| 4,417,158 A * | 11/1983 | Ito | H03K 5/1515 327/295 |
| 5,130,568 A * | 7/1992 | Miller | H03K 3/0375 327/202 |
| 6,069,498 A | 5/2000 | Noll et al. | |

(Continued)

FOREIGN PATENT DOCUMENTS

| | | |
|---|---|---|
| JP | 03277010 | 12/1991 |
| JP | 09139467 | 5/1997 |

*Primary Examiner* — Quan Tra
*Assistant Examiner* — Anh-Quan Tra
(74) *Attorney, Agent, or Firm* — Jones Day

(57) ABSTRACT

Circuits, systems, and methods are described herein for generating master clock signals and slave clock signals for controlling a flip-flop having a master latch and a slave latch. A circuit includes a master latch configured to latch an input data signal and to output a data latch signal based on a master clock signal. The circuit also includes a slave latch coupled to the master latch and configured to generate an output data signal based on a slave latch clock signal and the data latch signal. Additionally, the circuit includes a skewed clock circuit coupled to the master latch and the slave latch. The skewed clock circuit is configured to receive a clock signal and generate the master clock signal and the slave clock signal based on the clock signal. The master clock signal and the slave clock signal are independent clock signals whose timing is skewed relative to one another by the skewed clock circuit.

20 Claims, 7 Drawing Sheets

(56) References Cited

U.S. PATENT DOCUMENTS

| | | | |
|---|---|---|---|
| 6,239,639 | B1 | 5/2001 | Yaoi et al. |
| 6,452,433 | B1 | 9/2002 | Chang et al. |
| 7,315,196 | B2 * | 1/2008 | Wada .................... H02M 3/073 327/536 |
| 7,772,889 | B2 | 8/2010 | Naffziger |
| 7,872,513 | B2 * | 1/2011 | Uchida ............ H03K 3/356156 327/199 |
| 8,957,716 | B2 * | 2/2015 | Penzes ............... H03K 19/0008 327/202 |
| 8,988,124 | B2 | 3/2015 | Yokoyama et al. |
| 2009/0256609 | A1 * | 10/2009 | Naffziger ........... H03K 3/35625 327/212 |
| 2013/0021076 | A1 | 1/2013 | Kuenemund et al. |
| 2013/0154708 | A1 | 6/2013 | Zhang et al. |
| 2015/0236676 | A1 * | 8/2015 | Cai ........................ H03K 3/012 327/212 |
| 2016/0072484 | A1 | 3/2016 | Jarrar et al. |

* cited by examiner

MATCH-SLAVE LATCH WITH SKEWED CLOCK

PRIORITY CLAIM

This application is a continuation of U.S. patent application Ser. No. 17/075,759 filed Oct. 21, 2020, which, in turn, claims priority to U.S. Provisional Application No. 62/926,601, filed Oct. 28, 2019, the contents of both of which are incorporated herein by reference in their entirety.

TECHNICAL FIELD

This relates to semiconductor devices and more particularly to latches.

BACKGROUND

Latches are logic circuits that can be used to store information. A master-slave latch (e.g., flip-flop) is a clock edge triggered device. In other words, the output of a master-slave latch changes based on when the clock signal changes. Master-slave latches can utilize a common clock. Use of a common clock can cause timing margin issues often resolved with one or more buffers to inject additional time delay.

BRIEF DESCRIPTION OF THE DRAWINGS

Aspects of the present disclosure are best understood from the following detailed description when read with the accompanying figures.

DETAILED DESCRIPTION

Figure 1:
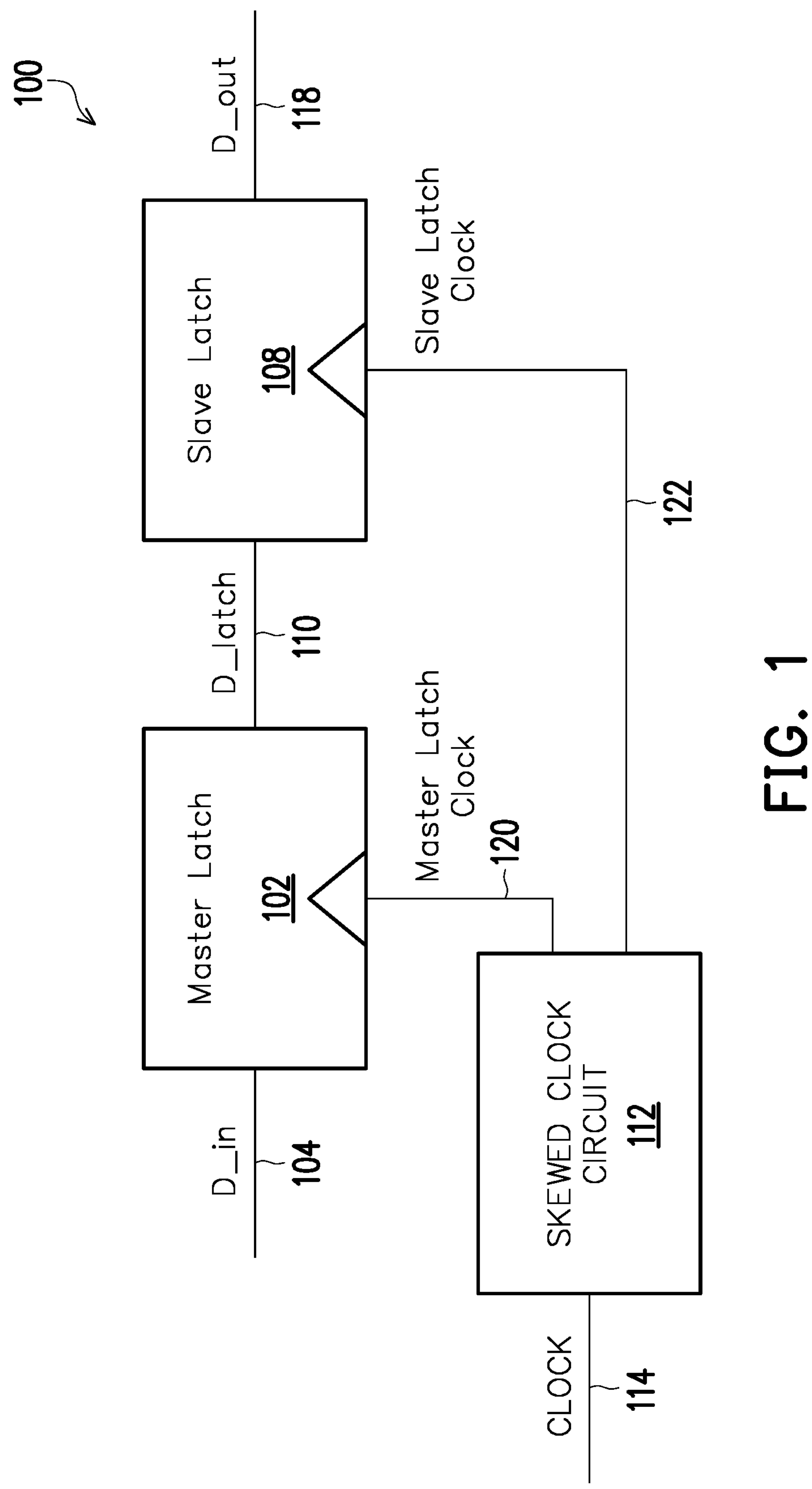
FIG. 1 depicts a block diagram of a master-slave flip-flop in accordance to various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Flip-flops are a type of synchronous circuit that depends on timing signals. A data flip-flop (e.g., D flip-flop) receives a digital clock signal (e.g., 0 or 1) and a data signal as input. The output of the flip-flop is dependent upon the state of digital clock signal and are known as edge-triggered devices. When the clock signal transitions from a logic low (e.g., '0') to a logic high (e.g., '1'), the clock signal is said to be "rising." Positive-edge triggered flip-flops output data equal to the input data when the clock signal is rising and holds the output at its previous value for all other times. Alternatively, when the clock signal transitions from a logic high (e.g., '1') to a logic low (e.g., '0'), the clock signal is said to be "falling." Negative-edge flip-flops output data equal to the input data when the clock signal is falling and holds the output at its previous value for all other times. Flip-flops may utilize one or more latches (e.g., a master latch and a slave latch), each responsive to a clock signal, to provide this functionality.

There are two key times associated with flip-flops that can impact the accuracy and/or stability of the output signal: (i) a setup time and (ii) a hold time. A setup time is an amount of time a data input into the flip-flop must be stable before a clock edge of an input clock signal. The hold time is a minimum amount of time that an input of a flip-flop must be stable after a clock edge of an input clock signal. In other words, there is a timing window surrounding a clock edge (e.g., before the clock edge and after the clock edge) where a data input must remain stable in order for the flip-flop to operate. A skewed block circuit is described herein that generates and provides individual clock signals sent to both the master latch and the slave latch. These individual clock signals are skewed by adding different delays to each clock signal. The skewing of the clock signals changes the time at which the latches receive a clock edge. By individually controlling the delays of the clock signals provided to the latches, the overall setup time can be decreased (e.g., a faster setup time).

FIG. 1 depicts a block diagram of a master-slave flip-flop 100 in accordance to various embodiments of the present disclosure. The master-slave flip-flop 100 includes a master latch 102 and a slave latch 108. The master latch 102 includes an input node configured to receive an input data signal 104 (e.g., D in). In an example, the data signal 104 is propagated to the master-slave flip-flop 100 via combinational logic of a sequential circuit. The master latch 102 is further configured to receive a master latch clock signal 120. The master latch clock signal 120 is provided by skewed clock circuit 112 and is based on an input clock signal 114 that is received by the skewed clock circuit 112.

The master-slave flip-flop 100 of FIG. 1 further includes the slave latch 108, which is configured to receive the data latch signal 110 output from the master latch 102. The slave latch 108 is further configured to receive a slave latch clock signal 122, which is provided by the skewed clock circuit 112 and is based on the input clock signal 114. An output node, D_out, 118 of the master-slave flip-flop 100 is included on the slave latch 108 and is used to read data out of the master-slave flip-flop 100. In an example, the master-slave flip-flop 100 includes a storage cell that provides data storage.

Figure 2:
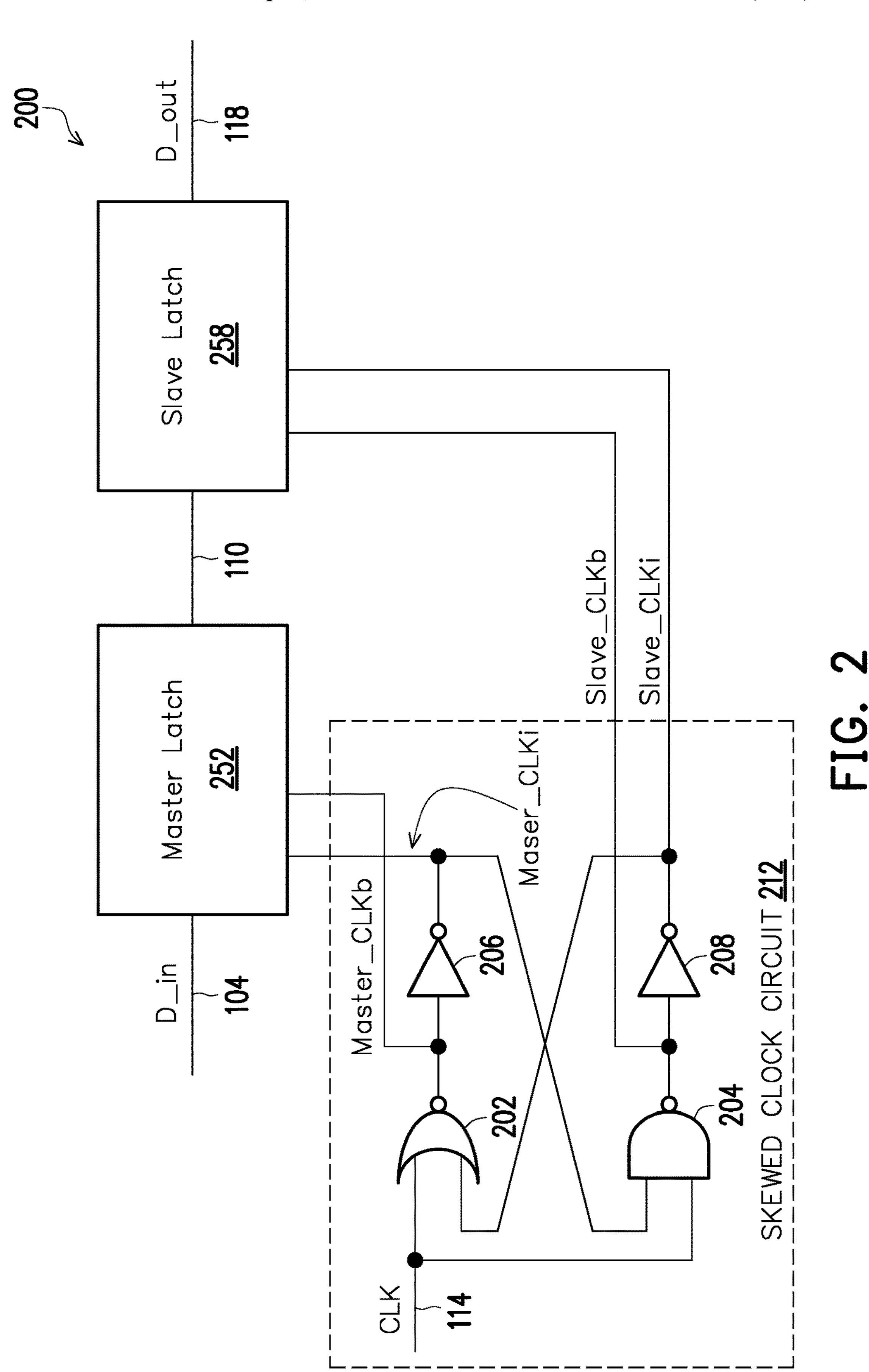
FIG. 2 depicts a diagram of a master-slave flip flop coupled to a skewed clock circuit in accordance with various embodiments of the present disclosure.
Figure 3:
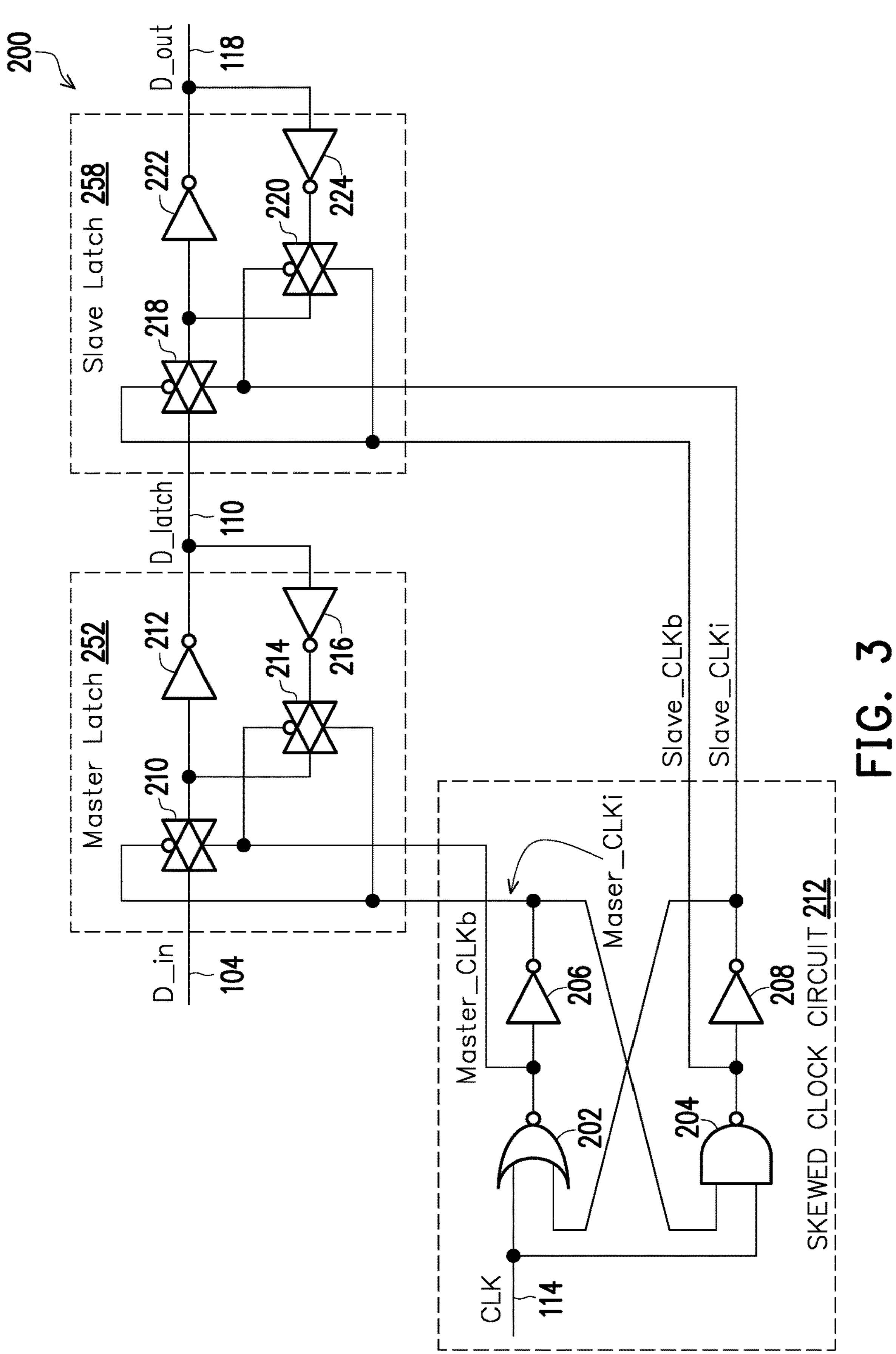
FIG. 3 further illustrates the coupling of a master-slave flip flop coupled to a skewed clock circuit in accordance with various embodiments of the present disclosure.

In some variations when the input clock signal 114 is low, the master latch clock signal 120 is delayed as described in more detail in FIGS. 2-3, the master latch 102 is transparent (e.g., ready to sample and store a data value) and the slave latch 108 is opaque (e.g., not sampling, but instead holding a previously sampled data value). In this variation, when the input clock signal 114 goes high, the slave latch clock signal 122 is delayed as described in more detail in FIGS. 2-3, the master latch 102 becomes opaque, and the slave latch 108 becomes transparent to effect a positive edge-triggered behavior.

Alternatively, in another example embodiment, when the input clock signal 114 is high, the master latch 102 is transparent and the slave latch 108 is opaque. In this variation, when the input clock signal 114 goes low, the master latch 102 becomes opaque, and the slave latch 108 becomes transparent to effect a negative edge-triggered behavior. Thus, the master-slave flip-flop 100 may be a positive edge-triggered flip-flop or a negative edge-triggered flip-flop.

The clock signals 120, 122 provided to the master and slave latches 102, 108, respectively, are generated by the skewed clock circuit 112. As explained in further detail below with respect to FIGS. 2-5, the skewed clock circuit 112 is configured to receive the input clock signal 114 and generate the master latch clock signal 120 and slave latch clock signal 122 based on the input clock signal 114.

FIG. 2 depicts a diagram of a master-slave flip flop 200 coupled to a skewed clock circuit 212 in accordance with various embodiments of the present disclosure. As previously described in FIG. 1, a skewed clock circuit, such as skewed clock circuit 212, generates and provides individual clock signals (e.g., master clock signal, Master_CLKb, and slave clock signal, Slave_CLKb) to master latch 252 and slave latch 258, respectively. Master latch 252 operates similar to master latch 102 described in FIG. 1. Slave latch 258 operates similar to slave latch 108 described in FIG. 1. In addition to these clock signals, skewed clock circuit 212 can also be generated and provide inverted versions of both clock signals (e.g., an inverted master clock signal, Master_CLKi and an inverted slave clock signal, Slave_CLKi). In some variations, skewed clock circuit 212 includes a plurality of logic gates such as NOR gate 202, NAND gate 204, and inverters 206, 208. Skewed clock circuit 212 receives an input clock signal 114 (e.g., CLK). Input clock signal 114 is provided as input to both NOR gate 202 and NAND gate 204. NOR gate 202 compares the input clock signal 114 with an inverted slave clock signal (e.g., Slave_CLKi) output by inverter 208. When both the input clock signal 114 and the inverted slave clock signal (e.g., Slave_CLKi) are logic lows (e.g., ‘0’), the NOR gate 202 generates a master clock signal (e.g., Master_CLKb) that is a logic high (e.g., ‘1’). For all other combinations of inputs, the master clock signal generated by NOR gate 202 is a logic low. Inverter 206 generates an inverted master clock signal that is the logical opposite of the master clock signal. Both the master clock signal and the inverted master clock signal are provided as inputs to the master latch 102.

The inverted master clock signal is also provided as another input to the NAND gate 204. NAND gate 204 compares the input clock signal 114 with the inverted master clock signal. When the input clock signal 114 and the inverted master clock signal are both logic highs, the slave clock signal generated by NAND gate 204 is a logic low. For all other logical combinations of inputs, the slave clock signal generated by NAND gate 204 is a logic high. Inverter 208 generates an inverted slave clock signal which is the logic opposite of the slave clock signal generated by NAND gate 204. Both the slave clock signal and the inverted slave clock signal are provided as inputs to the slave latch 108.

FIG. 3 further illustrates the coupling of a master-slave flip flop 200 coupled to a skewed clock circuit 212 in accordance with various embodiments of the present disclosure. Master latch 252 includes a plurality of transistors and inverters. More specifically, master latch 252 includes transmission gates 210, 214 and inverters 212, 216. A transmission gate is a bilateral switch that can be implemented using PMOS and NMOS transistors. The output of a transmission gate is based upon the logic levels of both the data input signal and control input. When the control input of a transmission gate is a logic high, the output of the transmission gate mirrors that of the input signal (e.g., transmission gate acts like an closed switch). When the control input of the transmission gate is a logic low, the transmission gate acts like an open switch.

Turning back to FIG. 3, a control terminal of transmission gate 210 receives the master clock signal output by NAND gate 204 and the inverted control terminal of transmission gate 210 receives the inverted master clock signal output by inverter 206. In other words, the transmission gate 210 is controlled by the master clock signal. When the master clock signal is a logic high, the transmission gate 210 acts as a closed switch and the input data signal 104 is provided as an input to inverter 212 which is coupled to the transmission gate 210. Inverter 212 generates the opposite logic signal as its input and outputs that as a data latch signal (e.g., D latch 110) provided to slave latch 258, which will be discussed in more detail below. Under these conditions (e.g., master clock latch being a logic high), the data latch signal is the logical opposite of the input data signal.

Just the opposite of transmission gate 210, the transmission gate 214 is controlled by the inverted master clock signal. Transmission gate 214 receives the master clock signal output by NAND gate 204 at the inverted control terminal and the control terminal of transmission gate 214 receives the inverted master clock signal output by inverter 206. The input to the transmission gate 214 is coupled to an output of inverter 216. Inverter 216 inverts the data latch signal output from inverter 212 and generates a signal that is the logical opposite of the data latch signal. When the master clock signal is a logic high, the inverted master clock signal is a logic low. With a logic low control signal, transmission gate 214 acts as an open switch and the inverter 216 is floating. Alternatively, when the master clock signal is a logic low, the inverted master clock signal is a logic high. The inverted master clock signal controls the transmission gate 214, which for the reasons previously discussed causes the transmission gate to act as a closed switch. With transmission gate 214 as a closed switch, the output of inverter 216 is coupled to the input of inverter 212. The transmission gate 210 acts as an open circuit as the control signal under these circumstances (e.g., master control signal) is a logic low. For the time that the master control signal is a logic low, the data input signal 104 is no longer provided to the input of inverter 212. Instead, the input to inverter 212 is the output of inverter 216 passed through transmission gate 214. When the data latch signal is a logic high, inverter 216 outputs a logic low which is passed through the closed switch of transmission gate 216 to inverter 212. That logic low is then converted by inverter 212 back to a logic high. Alternatively, when the data latch signal is a logic low, inverter 216 outputs a logic high. That logic high is passed through the closed switch of transmission gate 214 to the input of inverter 212. Inverter 212 coverts the logic high back to a logic low. In other words, when the master clock signal is a logic low, the data latch signal 110 output by master latch 252 is maintained at its prior state (e.g., the state when master clock signal was a logic high right before switching to a logic low).

The data latch signal 110 is provided as an input to slave latch 108. More specifically, slave latch 258, like master latch 252, includes a plurality of transistors and inverters. Namely, transmission gates 218, 220 and inverters 222, 224. A control terminal of transmission gate 218 receives the inverted slave clock signal output by inverter 208 of skewed clock circuit 212. The inverted control terminal of transmission gate 218 receives the slave clock signal output by NAND gate 204. In other words, the transmission gate 218 is controlled by the inverted slave clock signal (e.g., Slave_CLKi). The transmission gate 218 receives the data latch signal 110 output by master latch 102. When the inverted slave clock signal is a logic high, the transmission gate 218 acts as a closed switch and the data latch signal 110 is provided as an input to inverter 222 which is coupled to the output of transmission gate 218. Inverter 222 generates the opposite logic signal as its input and outputs that as an data output signal 118 (e.g., D_out). Under these conditions (e.g., inverted slave clock signal being a logic high), the data output signal 118 is an inverted data latch signal. Because the master latch 252 and slave latch 258 are driven by independently controlled clock signals (e.g., master latch controlled by master clock signals and slave latch controlled by slave clock signals), the data output signal 118 depends upon the previously described operations of master latch 252. In other words, the output data signal 118 may not be equivalent to that of the input data signal 104 under these conditions (e.g., inverted slave clock signal is a logic high). Instead, the data output signal 118 also depends upon the state of the master clock signal and the inverted master clock signal, as described in more detail in FIG. 6.

Just the opposite of transmission gate 218, the transmission gate 220 is controlled by the slave clock signal. Transmission gate 220 receives the slave clock signal output by NAND gate 204 at the control terminal and the inverted control terminal of transmission gate 220 receives the inverted slave clock signal output by inverter 208. The input to the transmission gate 220 is coupled to an output of inverter 224. Inverter 224 inverts the data output signal output from inverter 222 and generates a signal that is the logical opposite of the data output signal 118. When the inverted slave clock signal is a logic high, the slave clock signal is a logic low. With a logic low control signal, transmission gate 220 acts as an open switch and the inverter 224 is floating. Alternatively, when the slave clock signal is a logic high, the inverted slave clock signal is a logic low. The slave clock signal controls the transmission gate 220, which for the reasons previously discussed causes the transmission gate to act as a closed switch. With transmission gate 220 as a closed switch, the output of inverter 224 is coupled to the input of inverter 222. The transmission gate 218 acts as an open circuit as the control signal under these circumstances (e.g., inverted slave clock signal is a logic low). For the time that the inverted slave clock signal is a logic low, the data latch signal 110 is no longer provided to the input of inverter 222. Instead, the input to inverter 222 is the output of inverter 224 passed through transmission gate 220. When the data output signal 118 is a logic high, inverter 224 outputs a logic low which is passed through the closed switch of transmission gate 220 to inverter 222. That logic low is then converted by inverter 222 back to a logic high. Alternatively, when the data output signal 118 is a logic low, inverter 224 outputs a logic high. That logic high is passed through the closed switch of transmission gate 220 to the input of inverter 222. Inverter 222 coverts the logic high back to a logic low. In other words, when the slave clock signal is a logic high, the data output signal 118 output by slave latch 258 is maintained at its prior state (e.g., the state when the inverted slave clock signal was a logic low right before switching to a logic high).

Figure 4:
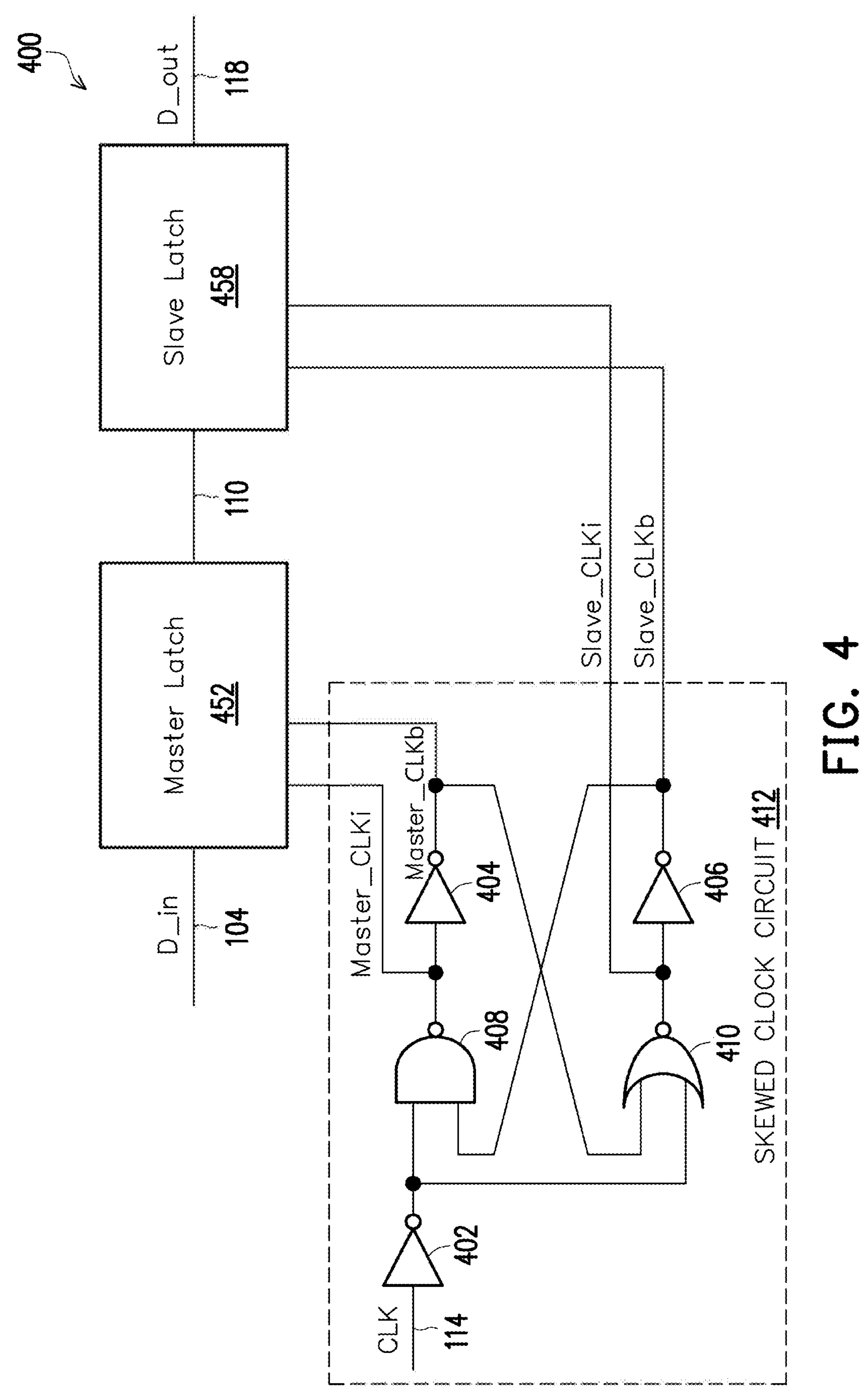
FIG. 4 depicts a diagram of a master-slave flip flop coupled to an example skewed clock circuit in accordance with various embodiments of the present disclosure.

FIG. 4 depicts a diagram of a master-slave flip flop 400 coupled to an example skewed clock circuit 412 in accordance with various embodiments of the present disclosure. As previously described in FIG. 1, a skewed clock circuit, such as skewed clock circuit 412, generates and provides individual clock signals (e.g., master clock signal, Master_CLKb, and slave clock signal, Slave_CLKb) to master latch 452 and slave latch 458, respectively. Master latch 452 operates the same as master latch 252 as described in FIG. 3. Slave latch 458 operates the same as slave latch 258. In addition to these clock signals, skewed clock circuitry 412 can also generate and provide inverted versions of both clock signals (e.g., an inverted master clock signal, Master_CLKi and an inverted slave clock signal, Slave_CLKi). In some variations, skewed clock circuitry 412 includes a plurality of logic gates such as inverters 402, 404, 406, NAND gate 408, and NOR gate 410. Skewed clock circuit 412 receives an input clock signal 114 (e.g., CLK). Input clock signal 114 is provided as input to inverter 402. Inverter 402 generates a logically opposite signal of input clock signal 114 and provides that to an input of NAND gate 408 and NOR gate 410. NAND gate 408 compares the inverted input clock signal output from inverter 402 with a slave clock signal (e.g., Slave_CLKb) output by inverter 406. NAND gate 408 generates an inverted master clock signal (e.g., Master_CLKi). When both the inverted clock signal from inverter 402 and the slave clock signal (e.g., Slave_CLKb) are logic are both logic highs, an inverted master clock signal generated by NAND gate 408 is a logic low. For all other logical combinations of inputs, the inverted master clock signal generated by NAND gate 408 is a logic high. Inverter 404 generates a master clock signal. Both the master clock signal and the inverted master clock signal are provided as inputs to the master latch 452.

The master clock signal output by inverter 404 is also provided as another input to the NOR gate 410. NOR gate 410 compares the inverted input clock signal with the master clock signal. When the inverted input clock signal and the master clock signal are both logic lows, the inverted slave clock signal generated by NOR gate 410 is a logic high. For all other logical combinations of inputs, the inverted slave clock signal generated by NOR gate 410 is a logic low. Inverter 406 generates a slave clock signal which is the logic opposite of the inverted slave clock signal generated by NOR gate 410. Both the slave clock signal and the inverted slave clock signal are provided as inputs to the slave latch 458.

Figure 5:
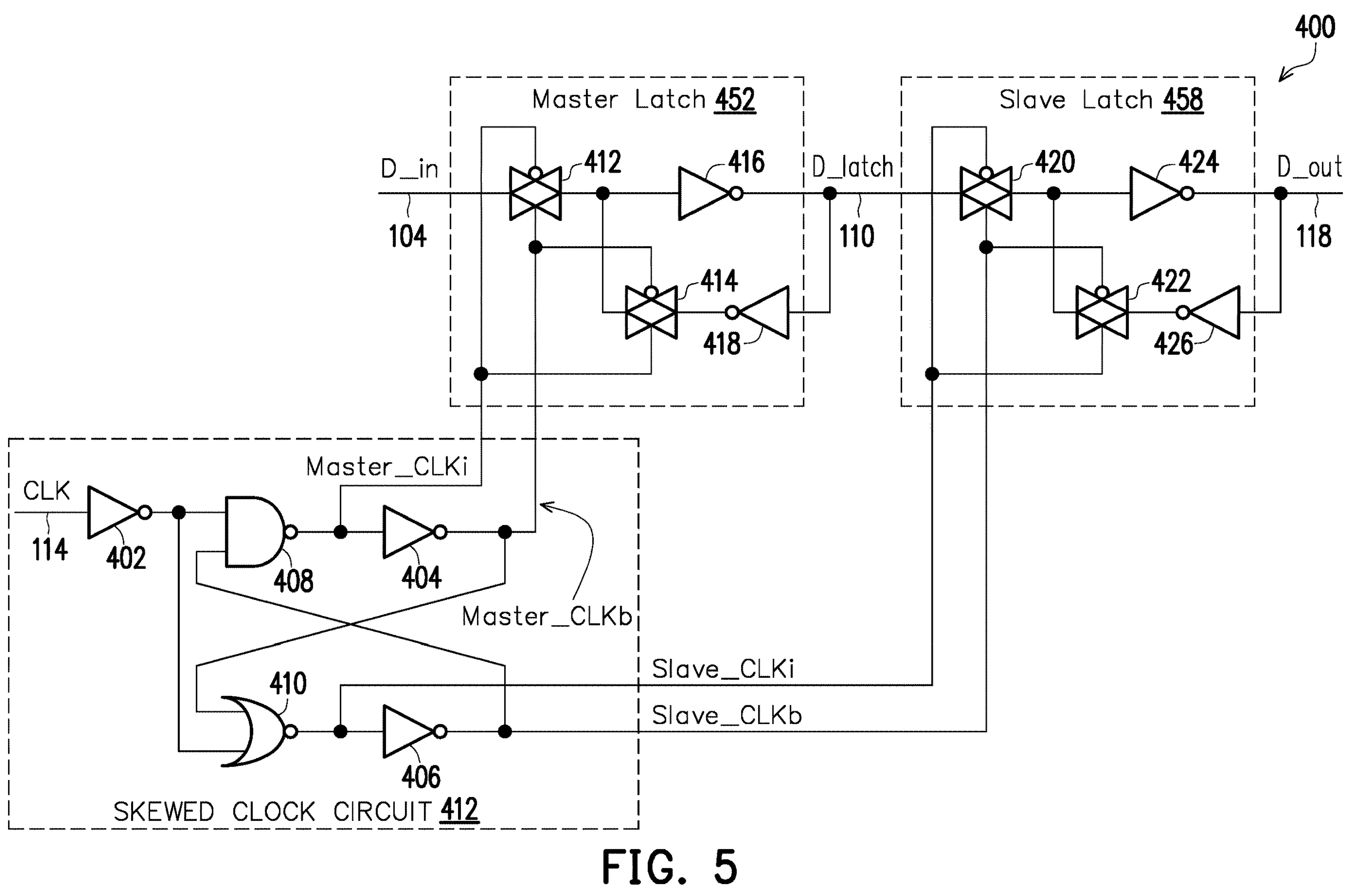
FIG. 5 further illustrates the coupling of a master-slave flip flop coupled to a skewed clock circuit in accordance with various embodiments of the present disclosure.

FIG. 5 further illustrates the coupling of a master-slave flip flop 400 coupled to a skewed clock circuit 412 in accordance with various embodiments of the present disclosure. The master latch 452 includes transmission gates 412, 414 and inverters 416, 418. Transmission gates 412, 414 operate similarly to transmission gates 210, 214, respectively, previously described in FIG. 3, with the exception being the sources of the master clock signal and the inverted master clock signal. Transmission gate 412 is controlled by the master clock signal generated by inverter 404. Transmission gate 414 is controlled by inverted master clock signal generated by NAND gate 408. All other operations of described in FIG. 3 for transmission gates 210, 214 apply to transmission gates 412, 414. Inverters 416, 418 operate the same as inverters 212, 216 described in FIG. 3.

Slave latch 458 includes transmission gates 420, 422 and inverters 424, 426. Transmission gates 420, 422 operate similarly to transmission gates 218, 220, respectively, as described in FIG. 3, with the exception being the sources of the slave clock signal and the inverted slave clock signal. Transmission gate 420 is controlled by inverted slave clock signal generated by NOR gate 410. Transmission gate 422 is controlled by the slave clock signal generated by inverter 406. All other operations of described in FIG. 3 for transmission gates 218, 220 apply to transmission gates 420, 422, respectively. Inverters 424, 426 operate the same as inverters 222, 224 described in FIG. 3.

The master latches 102, 252, 452 and slave latches 108, 258, 458 of FIGS. 2-5 are examples only, and master and slave latches may be implemented in various other ways that are known to those of ordinary skill in the art.

Figure 6:
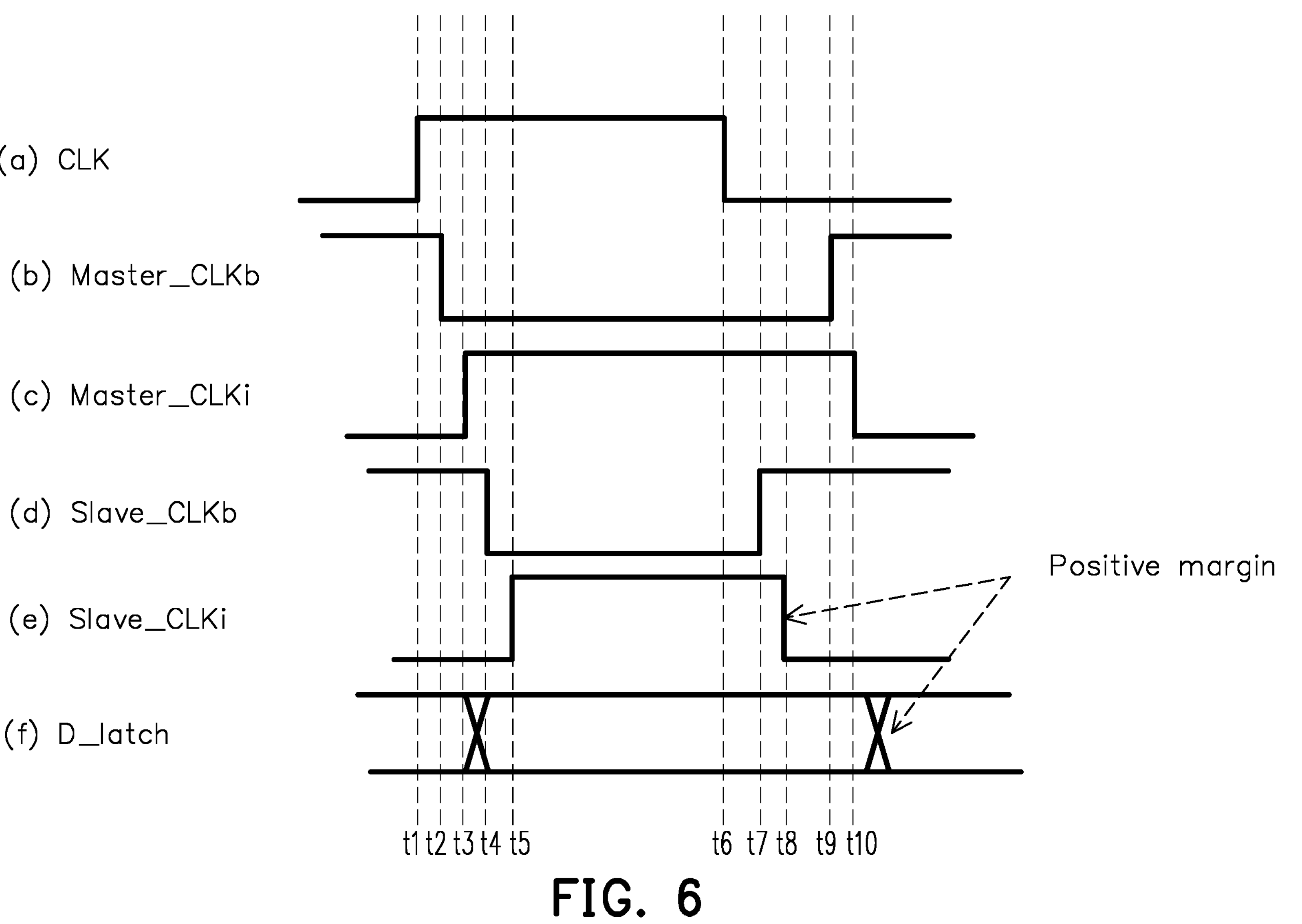
FIG. 6 is an exemplary timing diagram illustrating plots (a)-(f) of the various clock signals and data latch signal described in relation to FIGS. 2-3 in accordance with various embodiments of the present disclosure.

FIG. 6 is an exemplary timing diagram illustrating plots (a)-(f) of the various clock signals and data latch signal described in relation to FIGS. 2-3 in accordance with various embodiments of the present disclosure. Plot (a) illustrates a timing waveform for input clock signal 114 described in FIGS. 2-3. For example, plot (a) illustrates the clock signal 114 input into NOR gate 202 and NAND gate 204 of skewed clock circuit 212 in FIGS. 2-3. Plot (b) illustrates a timing waveform for the generated master clock signal (e.g., Master_CLKb) output from NOR gate 202 of skewed clock circuit 212 in FIGS. 2-3. When both the input clock signal 114 (e.g., CLK of plot (a)) and the inverted slave clock signal (e.g., Slave_CLKi of plot (e)) are logic lows, the NOR gate 202 generates a master clock signal (e.g., Master_CLKb of plot (b)) that is a logic high as illustrated before time t1, between times t9 and t10, and/or (iii) after time t10. For all other combinations of inputs, the master clock signal generated by NOR gate 202 (e.g., Master_CLKb of plot (b)) is a logic low as illustrated between times (i) t2 and t3, (ii) t3 and t4, (iii) t4 and t5, (iv) t5 and t6, (v) t6 and t7, and/or (vii) t7 and t8. It is noted that there is a small time delay illustrated in the waveform of plot (b) between transitioning from low/high or high/low (e.g., between times (i) t1 and t2 and/or (ii) t8 and t9) as detection of these changes may not be instantaneous.

Plot (c) illustrates a timing waveform for the inverted master clock signal (e.g., Master_CLKi) output from inverter 206 of skewed clock circuit 212 in FIGS. 2-3. Inverter 206 generates an inverted master clock signal that is the logical opposite of the master clock signal. For example, when the master clock signal (Master_CLKb of plot (b)) is a logic high, the inverted master clock signal (e.g., Master_CLKi of plot (c)) is a logic low as illustrated before time t1 and between times t1 and t2, and/or after time t10. When the master clock signal (Master_CLKb of plot (b)) is a logic low, the inverted master clock signal (e.g., Master_CLKi of plot (c)) is a logic high as illustrated between times (i) t3 and t4, (ii) t4 and t5, (ii) t5 and t6, (iv) t6 and t7, (v) t7 and t8, and/or (vi) t8 and t9. It is noted that there is a small time delay illustrated in the waveform of plot (c) between transitioning from low/high or high/low (e.g., between times (i) t2 and t3 and/or (ii) t9 and t10) as inversion of the input signal may not be instantaneous.

Plot (d) illustrates a timing waveform for the slave clock signal (e.g., Slave_CLKb) generated by NAND gate 204 of skewed clock circuit 212 in FIGS. 2-3. When the input clock signal 114 (e.g., CLK of plot (a)) and the inverted master clock signal (e.g., Master_CLKi of plot (c)) are both logic highs, the slave clock signal (e.g., Slave_CLKb) generated by NAND gate 204 is a logic low as illustrated between times (i) t4 and t5 and/or (ii) t5 and t6. For all other logical combinations of inputs, the slave clock signal (e.g., Slave_CLKb of plot (d)) generated by NAND gate 204 is a logic high as illustrated before time t1, between times (i) t1 and t2, (ii) t2 and t3, (iii) t6 and t7, (iv) t7 and t8, (v) t8 and t9, (vi) t9 and t10, and/or after time t10. It is noted that there is a small time delay illustrated in the waveform of plot (d) between transitioning from low/high or high/low (e.g., between times (i) t3 and t4 and/or (ii) t6 and t7) as detection of these changes may not be instantaneous.

Plot (e) illustrates a timing waveform for the inverted slave clock signal (e.g., Slave_CLKi) generated by inverter 208 of skewed clock circuit 212 in FIGS. 2-3. Inverter 208 generates an inverted slave clock signal (e.g., Slave_CLKi of plot (e)) which is the logic opposite of the slave clock signal (e.g., Slave_CLKb of plot (d)) generated by NAND gate 204. For example, when the slave clock signal (Slave_CLKb of plot (d)) is a logic high, the inverted slave clock signal (e.g., Slave_CLKi of plot (e)) is a logic low as illustrated before time t1, between times (i) t1 and t2, (ii) t2 and t3, (iii) t3 and t4, (iv) t7 and t8, (v) t8 and t9, (vi) t9 and t10, and/or after time t10. When the slave clock signal (Slave_CLKb of plot (d)) is a logic low, the inverted slave clock signal (e.g., Slave_CLKi of plot (e)) is a logic high as illustrated between times (i) t5 and t6 and/or (ii) t6 and t7. It is noted that there is a small time delay illustrated in the waveform of plot (e) between transitioning from low/high or high/low (e.g., between times (i) t4 and t5 and/or (ii) t7 and t8) as inversion of the input signal may not be instantaneous.

Plot (f) illustrates a timing waveform for the data latch signal 110 output from master latch 252 in FIGS. 2-3. 4-5. Comparing plot (e) with plot (f), the use of independently controlled clock signals facilitates a positive timing margin between the falling edge of the inverted clock signal and the timing window represented by an "X" on plot (f). This timing window reflects the combination of the setup time and the hold time for the flip-flop.

Figure 7:
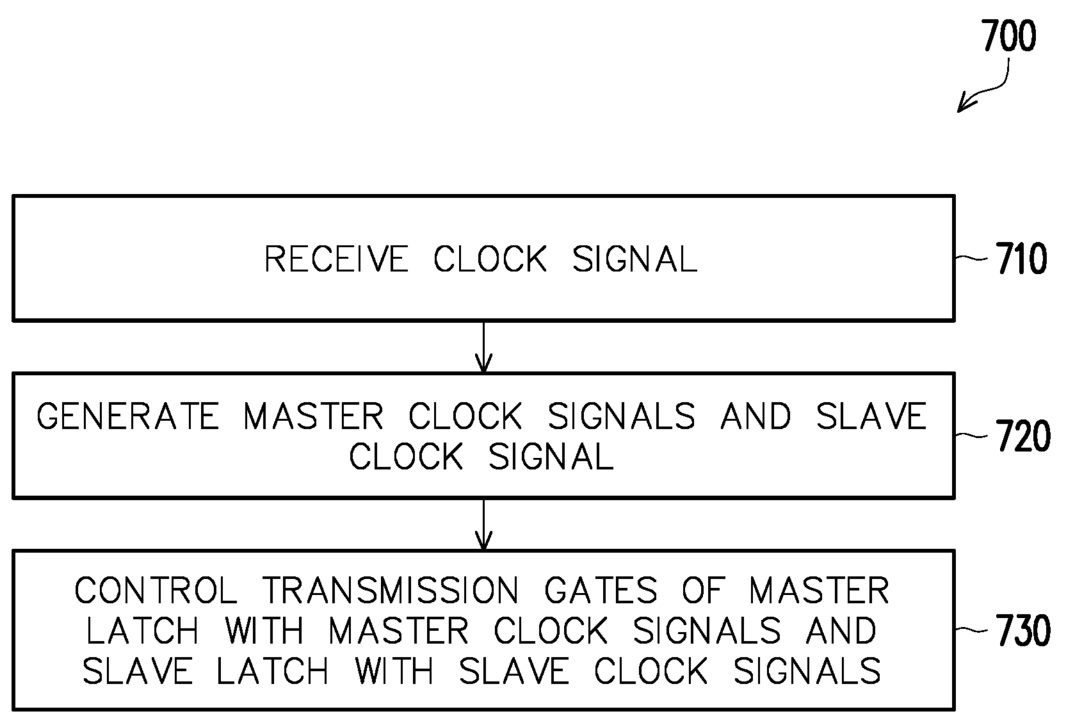
FIG. 7 is an exemplary flow chart illustrating a method for generating master clock signals and slave clock signals for controlling a flip-flop having a master latch and a slave latch in accordance with various embodiments of the present disclosure.

FIG. 7 is an exemplary flow chart illustrating a method for generating master clock signals and slave clock signals for controlling a flip-flop having a master latch and a slave latch in accordance with various embodiments of the present disclosure. While FIG. 7 is described here with reference to previously described structures for ease in understanding, it is understood that the method applies to many other structures as well. At step 710, a skewed clock circuit, such as skewed clock circuit 112 in FIG. 1, skewed clock circuit 212 in FIGS. 2-3, and/or skewed clock circuit 412 in FIGS. 4-5, receives a clock signal 114. The skewed clock circuit (e.g., skewed clock circuit 112 in FIG. 1, skewed clock circuit 212 in FIGS. 2-3, skewed clock circuit 412 in FIGS. 4-5) generates master clock signals (e.g., master clock signal (Master_CLKb) output from NOR gate 202 of skewed circuit 212 in FIGS. 2-3 or inverter 404 of skewed clock circuit 412 in FIGS. 4-5 and inverted master clock signal (Master_CLKi) output from inverter 206 of skewed clock circuit 212 in FIGS. 2-3 or NAND gate 408 of skewed clock circuit 412 in FIGS. 4-5) and slave clock signals (e.g., slave clock signal (Slave_CLKb) output from NAND gate 204 of skewed clock circuit in FIGS. 2-3 or inverter 406 of skewed clock circuit 412 in FIGS. 4-5 and inverted slave clock signal (Slave_CLKi) output from inverter 208 of skewed clock circuit 212 in FIGS. 2-3 or NOR gate 410 of skewed clock circuit 412 in FIGS. 4-5) at step 720. The master clock signal and the slave clock signal are independent clock signals. Transmission gates of the master latch (e.g., transmission gates 210, 214 of master latch 252 in FIG. 3, transmission gates 412, 414 of master latch 452 in FIG. 5) are controlled with the master clock signals (e.g., master clock signal and inverted master clock signal) and the transmission gate of the slave latch (e.g., transmission gates 218, 220 of slave latch 258 in FIG. 3, transmission gates 420, 422 of slave latch 458 in FIG. 5) are controlled with the slave clock signals (e.g., slave clock signal and inverted slave clock signal) at step 730.

Use of the various processes as described herein can provide a number of advantages. For example, use of the skewed clock circuits described herein can generate and provide individually controlled master and slave clock signals to master and slave latches of a flip-flop, respectively. These individually controlled clock signals can enable the flip-flop to have a faster setup time as the clock signals can be delayed individually and provided to the latches. These delayed clock signals can decrease the overall setup time (e.g., enabling a faster setup time).

In one embodiment, a circuit includes a master latch configured to latch an input data signal and to output a data latch signal based on a master latch clock signal. The circuit also includes a slave latch coupled to the master latch and configured to generate an output data signal based on a slave latch clock signal and the data latch signal. The circuit also includes a skewed clock circuit coupled to the master latch and the slave latch based on the clock signal. The skewed clock circuit is configured to receive a clock signal and generate the master latch clock signal and the slave latch clock signal. The master latch clock signal and the slave latch clock signal are independent clock signals whose timing is skewed relative to one another by the skewed clock circuit.

In another embodiment, a method of generating master clock signals and slave clock signals for controlling a flip-flop having a master latch and a slave latch includes receiving, by a skewed clock circuit, a clock signal. The skewed clock circuit generates master clock signals and slave clock signals. The master clock signal and the slave clock signal are independent clock signals. Transmission gates of the master latch is controlled with the master clock signals and the transmission gate of the slave latch is controlled with the slave clock signals.

In yet another embodiment, a device includes a data flip-flop comprising a plurality of latches and a clock circuit coupled to the data flip-flop. The clock circuit is configured to receive a clock signal and generate a plurality of clock signals. Each of the plurality of clock signals are independent of each other.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A circuit comprising:

a master latch configured to latch an input data signal and to output a data latch signal based on a master clock signal and an inverted and delayed version of the master clock signal, wherein the master latch includes:

a first transmission gate having an input terminal configured to receive the input data, a PMOS gate terminal configured to receive the master clock signal, and an NMOS gate terminal configured to receive the inverted and delayed version of the master clock signal; and a second transmission gate having an output terminal connected to the first transmission gate, an NMOS gate terminal configured to receive the master clock signal, and a PMOS gate terminal configured to receive the inverted and delayed version of the master clock signal;

a slave latch coupled to the master latch and configured to generate an output data signal based on a slave clock signal, an inverted and delayed version of the slave clock signal, and the data latch signal, wherein the slave latch includes:

a first transmission gate having an input terminal configured to receive the data latch signal, a PMOS gate terminal configured to receive the slave clock signal, and an NMOS gate terminal configured to receive the inverted and delayed version of the slave clock signal; and a second transmission gate having an output terminal connected to the first transmission gate, an NMOS gate terminal configured to receive the slave clock signal, and a PMOS gate terminal configured to receive the inverted and delayed version of the slave clock signal; and a skewed clock circuit coupled to the master latch and the slave latch and comprising both of a NOR gate and a NAND gate, the skewed clock circuit configured to receive a clock signal and generate the master clock signal, the inverted and delayed version of the master clock signal, the slave clock signal, and the inverted and delayed version of the slave clock signal, and wherein:

the master clock signal is directly taken from an output of the NAND gate to the PMOS gate terminal of the first transmission gate of the master latch; and the slave clock signal is directly taken from an output of the NOR gate to the PMOS gate terminal of the first transmission gate of the slave latch.

2. The circuit of claim 1, wherein each of the master latch and the slave latch further comprises:

a first inverter; and a second inverter connected in parallel to a series connection of the first transmission gate and the first inverter, wherein an output of the second inverter is coupled to an input terminal of the second transmission gate.

3. The circuit of claim 1, wherein the skewed clock circuit further comprises a third inverter and a fourth inverter, wherein:

the NAND gate is configured to compare an inverted version of the clock signal with the inverted and delayed version of the slave clock signal and generate the master clock signal;

the third inverter is coupled between the NAND gate and the master latch;

the third inverter is configured to invert the master clock signal;

the NOR gate is configured to compare the inverted version of the clock signal and the inverted and delayed version of the master clock signal and generate the slave clock signal;

the fourth inverter is coupled between the NOR gate and the slave latch; and the fourth inverter is configured to invert the slave clock signal.

4. A method of generating master clock signals and slave clock signals for controlling a flip-flop having a master latch and a slave latch, the method comprising:

receiving, by a skewed clock circuit, a clock signal, the skewed clock circuit including first and second inverters, a NOR gate, and a NAND gate;

generating, by the skewed clock circuit, a master clock signal, an inverted and delayed version of the master clock signal, a slave clock signal, and an inverted and delayed version of the slave clock signal;

receiving by the master latch and the NOR gate the inverted and delayed version of the master clock signal, and receiving by the slave latch and the NAND gate an inverted and delayed version of the slave clock signal; and controlling the master latch with the master clock signal and the slave latch with the slave clock signal, wherein the master latch is configured to latch an input data and to output a data latch signal, and the master latch includes:

a first transmission gate having an input terminal configured to receive the input data, a PMOS gate terminal configured to receive the master clock signal, and an NMOS gate terminal configured to receive the inverted and delayed version of the master clock signal; and a second transmission gate having an output terminal connected to the first transmission gate, an NMOS gate terminal configured to receive the master clock signal, and a PMOS gate terminal configured to receive the inverted and delayed version of the master clock signal, wherein the slave latch is configured to generate an output data signal based on the data latch signal, and the slave latch includes:

a first transmission gate having an input terminal configured to receive the data latch signal, a PMOS gate terminal configured to receive the slave clock signal, and an NMOS gate terminal configured to receive the inverted and delayed version of the slave clock signal; and a second transmission gate having an output terminal connected to the first transmission gate, an NMOS gate terminal configured to receive the slave clock signal, and a PMOS gate terminal configured to receive the inverted and delayed version of the slave clock signal, and wherein the master clock signal is directly taken from an output of the NAND gate to the PMOS gate terminal of the first transmission gate of the master latch, and wherein the slave clock signal is directly taken from an output of the NOR gate to the PMOS gate terminal of the first transmission gate of the slave latch.

5. The method of claim 4, further comprising:

comparing, by the NAND gate of the skewed clock circuit, an inverted version of the clock signal with the inverted and delayed version of the slave clock signal;

generating, by the NAND gate, the master clock signal based on the comparison of the inverted version of the clock signal with the inverted and delayed version of the slave clock signal;

inverting, by the first inverter which is coupled between the NAND gate and the master latch, the master clock signal;

comparing, by the NOR gate, the inverted version of the clock signal and the inverted and delayed version of the master clock signal;

generating, by the NOR gate, the slave clock signal based on the comparison of the inverted version of the clock signal and the inverted and delayed version of the master clock signal; and inverting, by the second inverter which is coupled between the NOR gate and the slave latch, an output of the NOR gate.

6. The method of claim 4, further comprising:

generating, by the skewed clock circuit, the inverted and delayed version of the master clock signal;

providing, by the skewed clock circuit, the inverted and delayed version of the master clock signal and the master clock signal to the master latch;

receiving, by the first transmission gate of the slave latch, the data latch signal from the master latch;

controlling the first transmission gate of the master latch using the inverted and delayed version of the master clock signal, wherein the first transmission gate of the master latch is configured to operate as a closed switch when the inverted and delayed version of the master clock signal is a logic high and output the input data signal;

inverting, by a third inverter of the master latch which is coupled to the second transmission gate of the master latch, the input data signal; and generating, by the third inverter of the master latch, the data latch signal.

7. The method of claim 6, further comprising:

inverting, by a fourth inverter of the master latch which is coupled to the third inverter of the master latch, the data latch signal;

generating, by the fourth inverter of the master latch, an inverted data latch signal; and controlling the second transmission gate of the master latch using the master clock signal, the second transmission gate of the master latch is configured to operate as a closed switch when the master clock signal is a logic high and pass through the inverted data latch signal.

8. The method of claim 4, further comprising:

generating, by the skewed clock circuit, the inverted and delayed version of the slave clock signal;

providing, by the skewed clock circuit, the slave clock signal and the inverted and delayed version of the slave clock signal to the slave latch;

controlling the first transmission gate of the slave latch using the inverted and delayed version of the slave clock signal, the first transmission gate of the slave latch is configured to operate as a closed switch when the inverted and delayed version of the slave clock signal is a logic high and output the data latch signal;

inverting, by a third inverter of the slave latch which is coupled to the first transmission gate of the slave latch, the data latch signal; and generating, by the third inverter of the slave latch, the output data signal.

9. The method of claim 8, further comprising:

inverting, by a fourth inverter of the slave latch which is coupled to the third inverter of the slave latch, the output data signal and output an inverted output data signal; and controlling the second transmission gate of the slave latch using the slave clock signal, the second transmission gate of the slave latch is configured to operate as a closed switch when the slave clock signal is a logic high and pass through the inverted output data signal to the third inverter of the slave latch.

10. A device comprising:

a data flip-flop comprising a plurality of latches, wherein a master latch and a slave latch of the plurality of latches respectively comprise:

a first transmission gate;

a first inverter;

a second inverter connected in parallel to a series connection of the first transmission gate and the first inverter; and a second transmission gate connected to a junction of the first inverter and the first transmission gate; and a clock circuit coupled to the data flip-flop having third and fourth inverters, a NOR gate, and a NAND gate, the clock circuit configured to receive a first clock signal and generate a master clock signal, an inverted and delayed version of the master clock signal, a slave clock signal, an inverted and delayed version of the slave clock signal, wherein the master latch is configured to latch an input data and to output a data latch signal, the first transmission gate of the master latch has an input terminal configured to receive the input data, a PMOS gate terminal configured to receive the master clock signal, and an NMOS gate terminal configured to receive the inverted and delayed version of the master clock signal, and the second transmission gate of the master latch has an output terminal connected to the first transmission gate of the master latch, an NMOS gate terminal configured to receive the master clock signal, and a PMOS gate terminal configured to receive the inverted and delayed version of the master clock signal;

wherein the slave latch is configured to generate an output data signal based on the data latch signal, the first transmission gate of the slave latch has an input terminal configured to receive the data latch signal, a PMOS gate terminal configured to receive the slave clock signal, and an NMOS gate terminal configured to receive the inverted and delayed version of the slave clock signal, and the second transmission gate of the slave latch has an output terminal connected to the first transmission gate of the slave latch, an NMOS gate terminal configured to receive the slave clock signal, and a PMOS gate terminal configured to receive the inverted and delayed version of the slave clock signal;

wherein the master clock signal is directly taken from an output of the NAND gate to the PMOS gate terminal of the first transmission gate of the master latch and the NMOS gate terminal of the second transmission gate of the master latch, and the slave clock signal is directly taken from an output of the NOR gate to the PMOS gate terminal of the first transmission gate of the slave latch and NMOS gate terminal of the second transmission gate of the slave latch.

11. The device of claim 10, wherein:

the NAND gate is configured to compare an inverted version of the first clock signal with the inverted and delayed version of the slave clock signal and generate the master clock signal;

the third inverter is coupled between the NAND gate and the data flip-flop;

the third inverter is configured to invert the master clock signal;

the NOR gate is configured to compare the inverted version of first clock signal and the inverted and delayed version of the master clock signal and generate the slave clock signal;

the fourth inverter is coupled between the NOR gate and the data flip-flop; and the fourth inverter is configured to invert the slave clock signal.

12. The device of claim 10, wherein the clock circuit generates the inverted and delayed version of the master clock signal that is provided to the master latch;

the first transmission gate in the master latch is controlled by the inverted and delayed version of the master clock signal, and configured to operate as a closed switch when the inverted and delayed version of the master clock signal is a logic high and output the input data signal;

the first inverter is coupled to the first transmission gate in the master latch, and configured to invert the input data signal and output the data latch signal;

the second inverter is coupled to the first inverter in the master latch, and configured to invert the data latch signal and output an inverted data latch signal; and the second transmission gate in the master latch is controlled by the master clock signal, and configured to operate as a closed switch when the master clock signal is a logic high and pass through the inverted data latch signal.

13. The device of claim 10, wherein the clock circuit generates the inverted and delayed version of the slave clock signal that is provided to the slave latch;

the first transmission gate in the slave latch is controlled by the inverted and delayed version of the slave clock signal and configured to receive the data latch signal from the master latch, and configured to operate as a closed switch when the inverted and delayed version of the slave clock signal is a logic high and output the data latch signal, wherein the first inverter is coupled to the first transmission gate in the slave latch and configured to invert the data latch signal and generate the output data signal, wherein the second inverter is coupled to the third first inverter in the slave latch and is configured to invert the output data signal and output an inverted output data signal; and the second transmission gate in the slave latch is controlled by the slave clock signal, and configured to operate as a closed switch when the slave clock signal is a logic high and pass through the inverted output data signal to the first inverter of the slave latch.

14. The circuit of claim 1, wherein the skewed clock circuit further comprises:

a third inverter having an input connected to an output of the NAND gate and an output connected to an input of the NOR gate; and a fourth inverter having an input connected to an output of the NOR gate and an output connected to an input of the NAND gate.

15. The circuit of claim 1, wherein the circuit is a flip-flop and the output data signal is configured to be read out of the flip-flop.

16. The circuit of claim 1, wherein the slave latch further includes first and second inverters connected in series, the output data signal is taken from a junction of an output of the first inverter of the slave latch and an input of the second inverter of the slave latch, and the junction of the output of the first inverter and the input of the second inverter is free of connection to additional one or more logic gates.

17. The circuit of claim 1, wherein the slave latch consists of the first transmission gate, a first inverter, a second inverter and the second transmission gate coupled to the first transmission gate and the second inverter, and the output data signal serves as an external output of the slave latch.

18. The circuit of claim 1, wherein the circuit is a flip-flop, and the output data signal is configured to be read out from an output pin of the flip-flop.

19. The circuit of claim 1, wherein a setup/hold timing window of the data latch signal reflects an amount of time that the data latch signal remains stable before a rising edge of the inverted slave clock signal and after a falling edge of the inverted slave clock signal.

20. The circuit of claim 1, wherein the skewed clock circuit includes a fifth inverter configured to receive the clock signal and to generate an inverted version of the clock signal to the NAND gate and the NOR gate.

* * * * *